US006816523B1

(12) United States Patent
Glenn et al.

(10) Patent No.: US 6,816,523 B1
(45) Date of Patent: Nov. 9, 2004

(54) VCSEL PACKAGE AND FABRICATION METHOD

(75) Inventors: Thomas P. Glenn, Gilbert, AZ (US); Roy Dale Hollaway, Chandler, AZ (US); Steven Webster, Muntinlupa (PH)

(73) Assignee: Amkor Technology, Inc., Chandler, AZ (US)

(*) Notice: Subject to any disclaimer, the term of this patent is extended or adjusted under 35 U.S.C. 154(b) by 217 days.

(21) Appl. No.: 09/940,103

(22) Filed: Aug. 27, 2001

(51) Int. Cl.⁷ .............................. H01S 5/00; H01S 3/04
(52) U.S. Cl. ...................................... 372/43; 372/36
(58) Field of Search ............................ 372/31, 45, 96, 372/33, 36, 43, 50; 398/182

(56) References Cited

U.S. PATENT DOCUMENTS 5,757,829 A * 5/1998 Jiang et al. .................... 372/31

| 6,151,344 A | 11/2000 | Kiely et al. .................... 372/38 |
| 6,612,757 B1 * | 9/2003 | Staudemeyer et al. ....... 398/182 |
| 2002/0126963 A1 * | 9/2002 | Burmeister ................... 385/88 |

FOREIGN PATENT DOCUMENTS

WO    WO 9929000    *  6/1999    ............. H01S/3/25

\* cited by examiner

*Primary Examiner*—Quyen Leung
(74) *Attorney, Agent, or Firm*—Gunnison, McKay & Hodgson, L.L.P.; Serge J. Hodgson

(57) ABSTRACT

A VCSEL package includes a substrate and a VCSEL device coupled to the substrate. The VCSEL device includes a first VCSEL and a calibration VCSEL. A sensor is coupled to the substrate such that a sensor area of the sensor is aligned with the calibration VCSEL. The sensor measures light from the calibration VCSEL to determine the power output of light emitted from the first VCSEL. The measured light is subsequently used to adjust the electrical power input to the VCSEL device to maintain the power output of the light emitted from the first VCSEL at a fixed or constant value.

41 Claims, 3 Drawing Sheets

VCSEL PACKAGE AND FABRICATION METHOD

BACKGROUND OF THE INVENTION

1. Field of the Invention

The present invention relates generally to the packaging of electronic components. More particularly, the present invention relates to a vertical cavity surface emitting laser (VCSEL) package and method of fabricating the same.

2. Description of the Related Art

Semiconductor lasers, such as vertical cavity surface emitting lasers (VCSELs) are well known. A VCSEL typically included an active area disposed or sandwiched between a first contact, sometimes called a laser anode, and a second contact. During operation, a voltage applied across the electrical contacts generated a current through the VCSEL.

The optical output power of the VCSEL was determined by the amount of current driven through the VCSEL. In certain applications, such as bar-code readers, digital video discs (DVDs) and compact discs (CDs), it was necessary or highly desirable to maintain a fixed optical output power.

The optical output power was maintained at a fixed or constant value through automatic power control (APC). Generally, automatic power control involved directly measuring the optical power output. The measured optical power output was subsequently used to adjust the electrical power input to the VCSEL and, thereby, to maintain the optical power output at a fixed or constant value.

As set forth in Kiely et al., U.S. Pat. No. 6,151,344, APC of a VCSEL was difficult because the VCSEL generally emitted light from only a single surface, thus making direct measurement of the optical power output and subsequent adjustment thereof a difficult task. Conventionally, the task of APC of a VCSEL had been accomplished by manually positioning an optical device or devices such as photodiodes, mirrors, beam splitters, or the like, in the optical path of the emissions from the VCSEL.

Typically, these optical devices were manually positioned with respect to the VCSEL package. However, manually positioning the optical devices presented several problems and disadvantages such as, high manufacturing cost, lack of repeatability, and poor quality control, thus prohibiting high-volume manufacturing.

To avoid these problems and disadvantages, Kiely et al., cited above, taught a semiconductor device, which included a VCSEL and a monolithically integrated lateral photodetector. The lateral photodetector controlled the optical power output of the VCSEL by monitoring or detecting the lateral spontaneous emissions from the VCSEL. The lateral photodetector generated a photocurrent from the spontaneous emissions, which was compared to a reference signal. The difference between the photocurrent and reference signal was used to alter the electrical power input to the VCSEL and thereby to control the optical power output at a fixed or constant value.

However, fabrication of the semiconductor device of Kiely et al. was relatively complex and expensive compared to the fabrication of a standard conventional VCSEL.

SUMMARY OF THE INVENTION

In accordance with one embodiment of the present invention, a vertical cavity surface emitting laser (VCSEL) package includes a substrate and a VCSEL device, i.e., an electronic component, coupled to the substrate. The VCSEL device includes a first VCSEL, sometimes called an active area, and a calibration VCSEL, sometimes called an active calibration area. A sensor, e.g., a controller diode, is coupled to the substrate, the sensor including a sensor area aligned with the calibration VCSEL.

The calibration VCSEL is substantially similar to or identical to the first VCSEL. However, light from the calibration VCSEL is measured by the sensor to determine the optical power output of the VCSEL device and, more particularly, of light emitted from the first VCSEL. The measured light is subsequently used to adjust the electrical power input to the VCSEL device to maintain the optical power output of the VCSEL device and, more particularly, of the light emitted from the first VCSEL, at a fixed or constant value.

Also in accordance with one embodiment of the present invention, a method of forming a VCSEL package includes coupling a VCSEL device within a pocket of a substrate. The VCSEL device includes an active area and an active calibration area. Bond wires are formed between bond pads of the VCSEL device and traces coupled to the substrate. A window is coupled to the substrate to seal the pocket. A sensor is coupled to the substrate such that a sensor area of the sensor is aligned with the active calibration area of the VCSEL device.

In one embodiment, the sensor is coupled to the substrate by mounting joints, e.g., solder, sometimes called solder joints. Advantageously, the sensor is mounted with the mounting joints at low cost. Accordingly, the VCSEL package is manufactured at a minimal cost. Further, the sensor is positioned with respect to the VCSEL device with extremely high accuracy as part of the VCSEL package. Accordingly, the characteristics of a plurality of VCSEL packages manufactured in high-volume in accordance with this embodiment of the present invention are highly repeatable.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
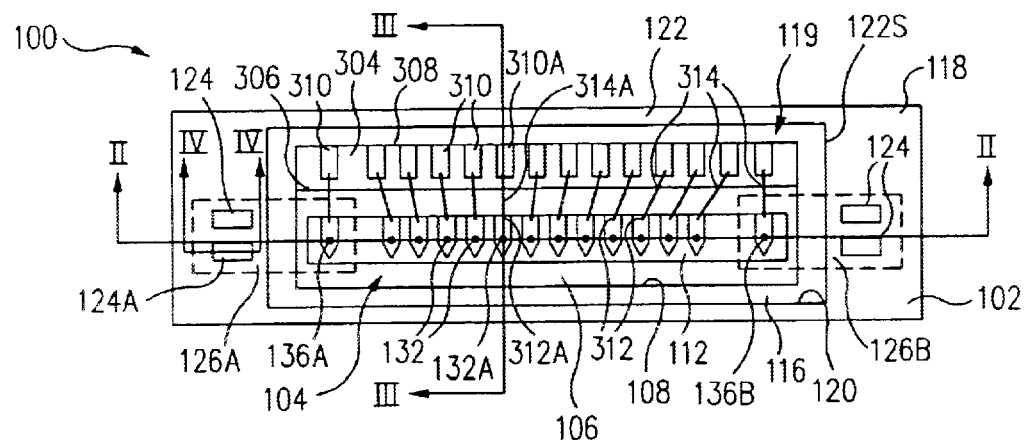
FIG. 1 is a top plan view of a vertical cavity surface emitting laser (VCSEL) package in accordance with one embodiment of the present invention.

In accordance with one embodiment of the present invention, a vertical cavity surface emitting laser (VCSEL)

package 100 (FIGS. 1, 2) includes a VCSEL device 112 including calibration VCSELs 136A, 136B, which are substantially similar to or identical to VCSELs 132 of VCSEL device 112. However, light 138 from calibration VCSELs 136A, 136B is measured by sensors 126A, 126B to determine the power output of light 134 emitted from VCSELs 132. The measured light 138 is subsequently used to adjust the electrical power input to VCSEL device 112 to maintain the power output of light 134 emitted from VCSELs 132 at a fixed or constant value.

In one embodiment, sensors 126A, 126B are mounted to substrate by mounting joints 130, e.g., solder, sometimes called solder joints. Advantageously, sensors 126A, 126B are mounted at low cost. Accordingly, VCSEL package 100 is manufactured at a minimal cost. Further, sensors 126A, 126B are positioned with respect to VCSEL device 112 with extremely high accuracy as part of VCSEL package 100. Accordingly, the characteristics of a plurality of VCSEL packages 100 manufactured in high-volume in accordance with this embodiment of the present invention are highly repeatable.

Figure 2:
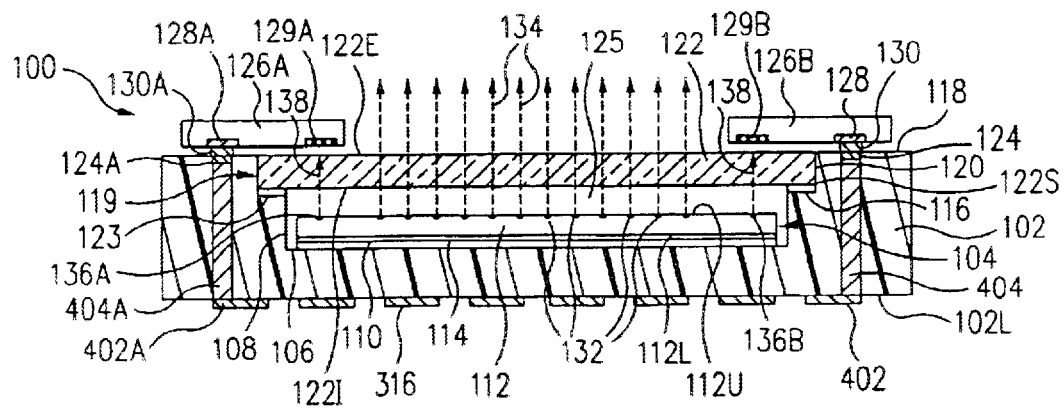
FIG. 2 is a cross-sectional view of the VCSEL package along the line II—II of FIG. 1.

More particularly, FIG. 1 is a top plan view of a VCSEL package 100 in accordance with one embodiment of the present invention. FIG. 2 is a cross-sectional view of VCSEL package 100 along the line II—II of FIG. 1.

Referring now to FIGS. 1 and 2 together, VCSEL package 100 includes a substrate 102. Illustratively, substrate 102 is ceramic, liquid crystal polymer (LCP), although substrate 102 is formed of other materials in other embodiments.

Substrate 102 includes a VCSEL pocket 104, sometimes called a recess or compartment. More particularly, VCSEL pocket 104 is defined by a base 106, e.g., a first surface, and a pocket sidewall 108, e.g., a second surface, of substrate 102.

Formed on base 106 is an electrically conductive ground plane 110, sometimes called a reference conductor. Mounted to ground plane 110 and located within VCSEL pocket 104 is a VCSEL device 112, e.g., a semiconductor chip, sometimes called an electronic component. VCSEL device 112 includes an upper, e.g., first, surface 112U and a lower, e.g., second, surface 112L. Lower surface 112L is mounted and electrically connected to ground plane 110 and thus to substrate 102 with an electrically conductive adhesive 114, e.g., an electrically conductive epoxy or solder.

Substrate 102 further includes a shelf 116, e.g., a third surface of substrate 102. In this embodiment, shelf 116 is parallel to base 106. Further, pocket sidewall 108 is perpendicular to and extends between base 106 and shelf 116. Shelf 116 extends around the entire periphery of VCSEL pocket 104.

Substrate 102 further includes a sensor mounting surface 118, sometimes referred to as a photodiode mounting surface, e.g., a forth surface of substrate 102. In this embodiment, sensor mounting surface 118 is parallel to base 106 and shelf 116. Further, a shelf sidewall 120, e.g., a fifth surface of substrate 102, is perpendicular to and extends between shelf 116 and sensor mounting surface 118. Shelf 116 and shelf sidewall 120 define a window pocket 119.

VCSEL pocket 104 is sealed with a window 122, e.g., borosilicate glass. More particularly, a periphery of an inner, e.g., first, surface 122I of window 122 is mounted to shelf 116 by an adhesive 123. In one embodiment, adhesive 123 also fills the gap between a side 122S of window 122 and shelf sidewall 120 thus enhancing the bond between window 122 and substrate 102. Generally, window 122 is mounted within window pocket 119.

Advantageously, VCSEL device 112 is sealed within a cavity 125 defined by window 122, adhesive 123, and VCSEL pocket 104. By sealing VCSEL device 112 within cavity 125, VCSEL device 112 is protected from the ambient environment, e.g., dust and moisture.

Formed on sensor mounting surface 118 are surface mount pads 124, including a first surface mount pad 124A. Mounted to surface mount pads 124 are sensors 126A, 126B, sometimes called controller diodes. Illustratively, sensors 126A, 126B are photodiodes, diodes, transistors, or other control devices, hereinafter collectively referred to as sensors 126. Sensors 126 are indicated in dashed lines in FIG. 1 for purposes of clarity.

More particularly, terminals 128 of sensors 126 are mounted to surface mount pads 124 by mounting joints 130, e.g., solder, sometimes called solder joints. In addition, mounting joints 130 form the electrical interconnections between terminals 128 of sensors 126 and surface mount pads 124.

To illustrate, a first terminal 128A of the plurality of terminals 128 is physically and electrically connected to surface mount pad 124A by a first mounting joint 130A of the plurality of mounting joints 130. The other terminals 128 are physically and electrically connected to the other surface mount pads 124 by the other mounting joints 130 in a similar manner and so are not discussed further to avoid detracting from the principals of the invention.

Sensors 126 are mounted to extend above window 122. More particularly, sensors 126 extend inwards from sensor mounting surface 118 beyond side 122S of window 122 to be adjacent to an exterior, e.g., second, surface 122E of window 122.

VCSEL device 112 includes a plurality of VCSELs 132, sometimes called active areas. During use, VCSELs 132 emit light 134, i.e., electromagnetic radiation such as visible light although electromagnetic radiation other than visible light are emitted in other embodiments.

In this embodiment, VCSEL device 112 further includes a first calibration VCSEL 136A and a second calibration VCSEL 136B, collectively referred to as calibration VCSELs 136. Calibration VCSELs 136 are sometimes called active calibration areas. Generally, VCSEL device 112 includes at least one calibration VCSEL 136. During use, calibration VCSELs 136 emit light 138, i.e., electromagnetic radiation such as visible light although electromagnetic radiation other than visible light are emitted in other embodiments.

In this embodiment, light 134 and light 138 are the same electromagnetic radiation, i.e., have the same wavelength. However, in an alternative embodiment, light 134 is a first electromagnetic radiation, i.e., has a first wavelength, and light 138 is a second electromagnetic radiation, i.e., has a second wavelength, the second electromagnetic radiation being different than the first electromagnetic radiation. Generally, window 122 is transparent to light 134 and light 138.

Sensors 126 do not extend above VCSELs 132. Stated another way, sensors 126 do not obstruct light 134 emitted from VCSELs 132. For example, a waveguide (not shown) is brought into abutting contact with exterior surface 122E of window 122. Light 134 emitted from VCSELs 132 passes through window 122 and into the waveguide.

Calibration VCSELs 136 are substantially similar to or identical to VCSELs 132. However, light 138 from calibration VCSELs 136 is measured by sensors 126 to determine the optical power output of VCSEL device 112 and, more particularly, of light 134 emitted from VCSELs 132. The measured light 138 is subsequently used to adjust the electrical power input to VCSEL device 112 to maintain the optical power output of VCSEL device 112 and, more particularly, of light 134 emitted from VCSELs 132, at a fixed or constant value.

Sensor areas 129A, 129B, collectively sensor areas 129, of sensors 126 directly measure light 138 from calibration VCSELs 136. More particularly, sensor areas 129 of sensors 126 are positioned directly above and aligned with calibration VCSELs 136. Stated another way, calibration VCSELs 136 are positioned adjacent interior surface 122I of window 122 directly opposite of the position of sensor areas 129 of sensors 126 adjacent exterior surface 122E of window 122. Light 138 from calibration VCSELs 136 passes through window 122 and strikes sensor areas 129 of sensors 126, which measure light 138 as those of skill in the art will understand in light of this disclosure.

To illustrate, sensor area 129A of sensor 126A is positioned directly above and aligned with calibration VCSEL 136A. Light 138 from calibration VCSEL 136A passes through window 122 and strikes sensor area 129A of sensor 126A, which measures light 138 as those of skill in the art will understand in light of this disclosure. Similarly, sensor area 129B of sensor 126B measures light 138 from calibration VCSEL 136B.

Advantageously, sensors 126 are mounted with mounting joints 130 at low cost. Accordingly, VCSEL package 100 is manufactured at a minimal cost. Further, sensors 126 are positioned with respect to VCSEL device 112 with extremely high accuracy as part of VCSEL package 100. Accordingly, the characteristics of a plurality of VCSEL packages 100 manufactured in high-volume are highly repeatable.

Although two calibration VCSELs 136A, 136B and two sensors 126A, 126B are set forth, in an alternative embodiment, VCSEL package 100 includes only a single calibration VCSEL, e.g., calibration VCSEL 136A or 136B, and only a single sensor, e.g., sensor 126A or 126B, respectively. In yet another alternative embodiment, VCSEL package 100 includes more than two calibration VCSELs 136 and more than two sensors 126.

Figure 3:
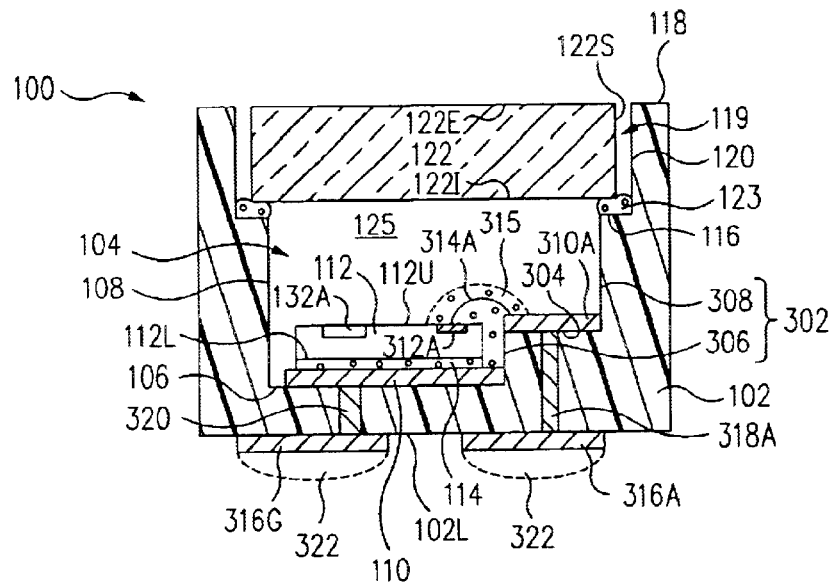
FIG. 3 is a cross-sectional view of the VCSEL package along the line III—III of FIG. 1.

FIG. 3 is a cross-sectional view of VCSEL package 100 along the line III—III of FIG. 1. Referring now to FIGS. 1 and 3 together, formed along one side 302 of pocket sidewall 108 is a lead step 304, e.g., a sixth surface, of substrate 102. More particularly, side 302 of pocket sidewall 108 includes a step lower sidewall 306, e.g., a seven surface, of substrate 102 and a step upper sidewall 308, e.g., an eighth surface, of substrate 102. Lead step 304 is perpendicular to and extends between step lower sidewall 306 and step upper sidewall 308.

In this embodiment, step lower sidewall 306 is perpendicular to and extends between base 106 and lead step 304. Step upper sidewall 308 is perpendicular to and extends between lead step 304 and sensor mounting surface 118.

Formed on lead step 304 are a plurality of electrically conductive upper traces 310, including a first upper trace 310A. Upper traces 310 are electrically connected to bond pads 312 of VCSEL device 112 on upper surface 112U by electrically conductive bond wires 314, including a first bond wire 314A.

To illustrate, upper trace 310A is electrically connected to a first bond pad 312A of the plurality of bond pads 312 by bond wire 314A. The other upper traces 310 are electrically connected to the other bond pads 312 by the other bond wires 314 in a similar manner and so are not discussed further to avoid detracting from the principals of the invention.

In one embodiment, bond pads 312, bond wires 314 and upper traces 310 are enclosed in an encapsulant 315, indicated by the dashed line in FIG. 3. However, as shown in FIG. 3, encapsulant 315 does not cover VCSELs 132 and calibration VCSELs 136. However, in an alternative embodiment, encapsulant 315, e.g., an encapsulant transparent to light 134 and light 138, entirely fills VCSEL pocket 104 and covers VCSELs 132 and calibration VCSELs 136.

Referring still to FIGS. 1 and 3, in this embodiment, bond pads 312 are associated with VCSELs 132 and calibration VCSELs 136 as those of skill in the art will understand in light of this disclosure. To illustrate, bond pad 312A is associated with a first VCSEL 132A of the plurality of VCSELs 132.

By controlling the electrical signal, e.g., voltage, on bond pad 312A, the power output of light 134 from VCSEL 132A is controlled. The other bond pads 312 are associated with the other VCSELs 132 and calibration VCSELs 136 in a similar manner and so are not discussed further to avoid detracting from the principals of the invention.

As shown in FIG. 3, upper trace 310A is electrically connected to a first electrically conductive lower pad 316A of a plurality of electrically conductive lower pads 316 (see FIG. 2) on a lower surface 102L of substrate 102 by an electrically conductive via 318A.

As set forth above, an electrically conductive pathway between bond pad 312A and lower pad 316A is formed by bond wire 314A, upper trace 310A and via 318A. The other bond pads 312, bond wires 314, upper traces 310, vias 318 and lower pads 316 are electrically connected to one another in a similar fashion and so are not discussed further to avoid detracting from the principals of the invention.

Further, ground plane 110 is electrically connected to a first electrically conductive lower ground pad 316G on lower surface 102L of substrate 102 by an electrically conductive ground via 320. Generally, VCSEL package 100 includes at least one lower ground pad 316G and associated ground via 320. During use, lower ground pad 316G is electrically connected to a reference voltage source, e.g., ground, thus maintaining ground plane 110 at a common potential, e.g., ground. Ground plane 110 forms the first contact for VCSEL device 112 and bond pads 312 form the second contacts for VCSEL device 112.

Although particular electrically conductive pathways between bond pad 312A, ground plane 110 and lower pad 316A, lower ground pad 316G, respectively, are described above, in light of this disclosure, it is understood that other electrically conductive pathways can be formed. For example, substrate 102 is a multi-layered substrate and, instead of straight-through vias 318, 320, a plurality of electrically conductive traces on various layers in substrate 102 are interconnected by a plurality of electrically conductive vias to form the electrical interconnections between upper traces 310, ground plane 110 and lower pads 316, lower ground pad(s) 316G, respectively.

As another alternative, lower pads 316, lower ground pad(s) 316G are distributed in an array format to form a land grid array (LGA) package. Alternatively, solder balls 322 indicated in dashed lines are formed on lower traces 316, lower ground trace(s) 316G, e.g., to form a ball grid array (BGA) package. As yet another alternative, VCSEL package 100 is formed as a leadless chip carrier (LCC) package. Other electrically conductive pathway modifications will be obvious to those of skill in the art.

Figure 4A:
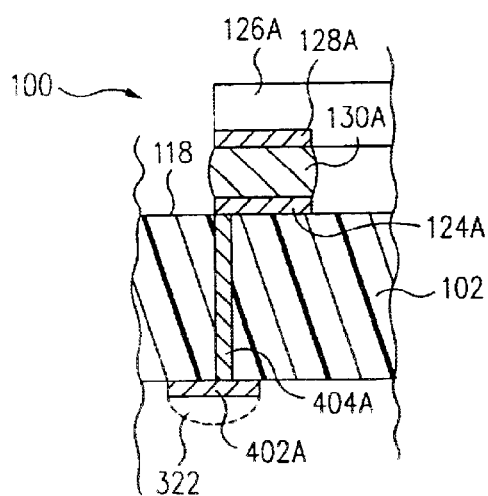
FIG. 4A is a cross-sectional view of the VCSEL package along the line IV—IV of FIG. 1 in accordance with one embodiment of the present invention.

FIG. 4A is a cross-sectional view of VCSEL package 100 along the line IV—IV of FIG. 1 in accordance with one embodiment of the present invention. Referring now to FIGS. 1, 2 and 4A together, surface mount pads 124 are electrically connected to electrically conductive lower sensor pads 402 on lower surface 102L of substrate 102 by electrically conductive sensor vias 404.

To illustrate, surface mount pad 124A is electrically connected to a first lower sensor pad 402A of the plurality of lower sensor pads 402 by a first sensor via 404A of the plurality of sensor vias 404. The other surface mount pads 124 are electrically connected to the other lower sensor pads 402 by the other sensor vias 404 in a similar manner and so are not discussed further to avoid detracting from the principals of the invention.

In one embodiment, lower sensor pads 402 are distributed in an array format along with lower pads 316, lower ground pads 316G to form a land grid array (LGA) package as discussed above. Alternatively, solder balls 322 indicated in dashed lines are formed on lower sensor pads 402 along with lower traces 316, lower ground trace 316G, e.g., to form a ball grid array (BGA) package as described above. Generally, solder balls 322 or pads 402, 316, 316G are electrically connected to the larger substrate, e.g., printed circuit mother board, as those of skill in the art will understand in light of this disclosure.

Figure 4B:
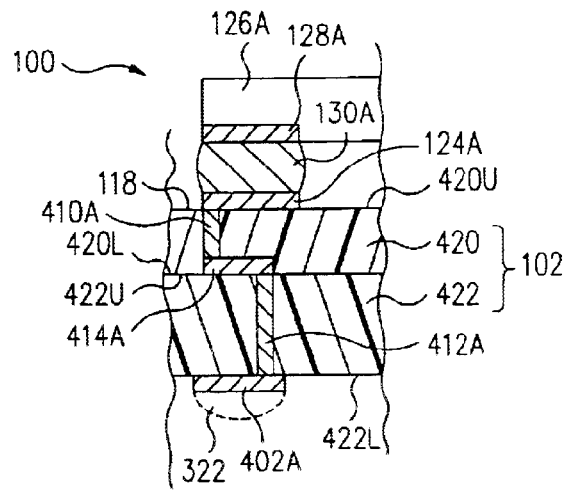
FIG. 4B is a cross-sectional view of the VCSEL package along the line IV—IV of FIG. 1 in accordance with another embodiment of the present invention.

FIG. 4B is a cross-sectional view of VCSEL package 100 along the line IV—IV of FIG. 1 in accordance with another embodiment of the present invention. Referring now to FIGS. 1, 2 and 4B together, instead of a straight through sensor via 404A (FIG. 4A), surface mount pad 124A is electrically connected to lower sensor pad 402A by an electrically conductive upper sensor via 410A, an electrically conductive lower sensor via 412A, and an electrically conductive interlayer sensor trace 414A.

More particular, substrate 102 is a multilayered substrate and includes an upper, e.g., first, substrate layer 420 mounted or otherwise bonded to a lower, e.g., second, substrate layer 422. Surface mount pad 124A is on an upper, e.g., first, surface 420U of upper substrate layer 420. Interlayer sensor trace 414A is formed at the interface of a lower, e.g., second, surface 420L of upper substrate layer 420 and an upper, e.g., first, surface 422U of lower substrate layer 422.

Upper sensor via 410A is electrically connected to and extends between surface mount pad 124A and interlayer sensor trace 414A. Similarly, lower sensor via 412A is electrically connected to and extends between interlayer sensor trace 414A and lower sensor pad 402A. Lower sensor pad 402A is on a lower, e.g., second, surface 422L of lower substrate layer 422. Generally, sensor vias 410A, 412A extend through substrate layers 420, 422, respectively.

As shown in FIG. 4B, upper sensor via 410A is horizontally offset from lower sensor via 412A and interlayer sensor trace 414A provides the horizontal electrical connection between upper sensor via 410A and lower sensor via 412A. In this manner, surface mount pad 124A is electrically connected to lower sensor pad 402A, which can be horizontal offset from surface mount pad 124A by a significant distance.

Although substrate 102 is illustrated and discussed above as having two substrate layers, i.e., upper substrate layer 420 and lower substrate layer 422, and two sensor vias, i.e., upper sensor via 410A and lower sensor via 412A, in an alternative embodiment, substrate 102 includes more than two substrate layers and associated sensor vias. Further, instead of having upper substrate layer 420 as a separate structure that is mounted to lower substrate layer 422, in an alternative embodiment, upper substrate layer 420 and lower substrate layer 422 are sections of a single integral piece, i.e., are a single piece and not a plurality of separate pieces connected together.

Figure 5:
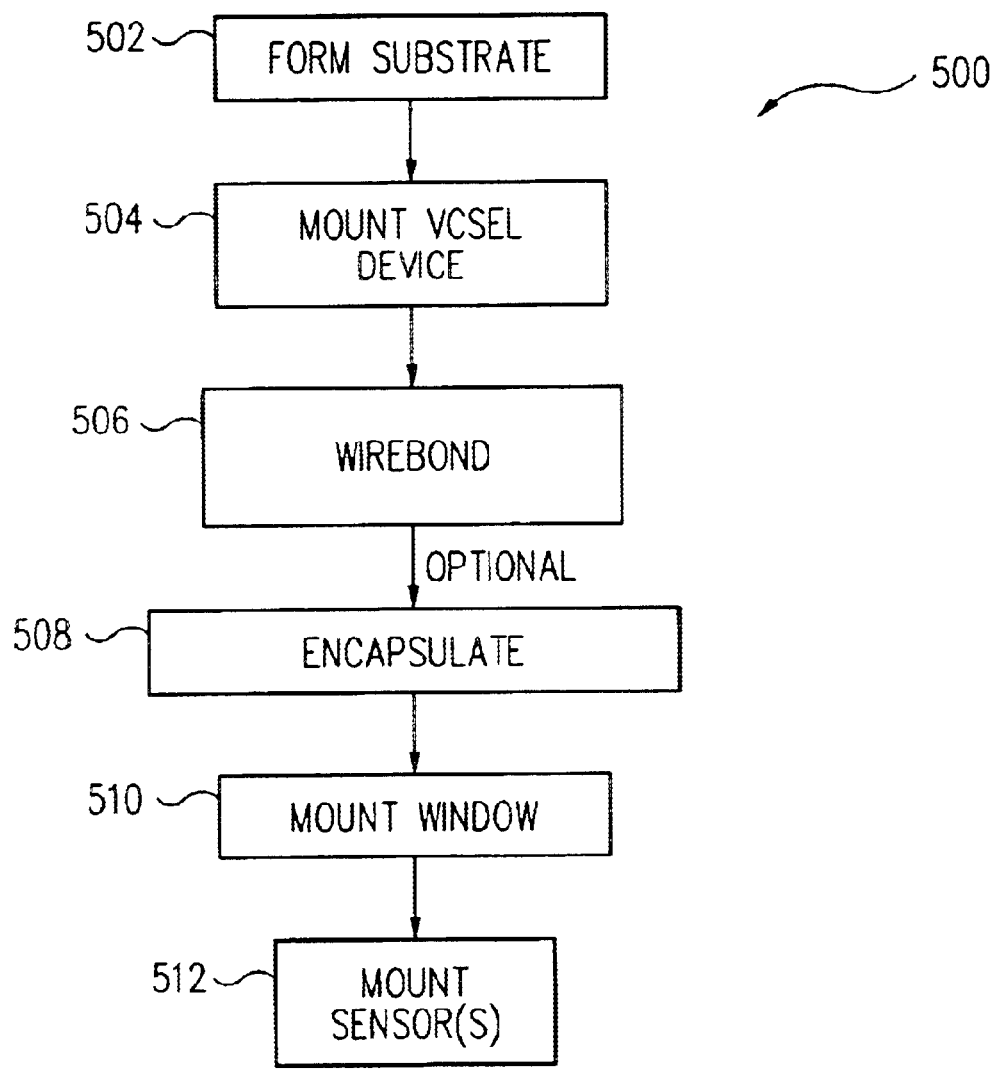
FIG. 5 is a block diagram illustrating operations in a process for manufacturing the VCSEL package of FIGS. 1 and 2 in accordance with one embodiment of the present invention.

FIG. 5 is a block diagram 500 illustrating operations in a process for manufacturing VCSEL package 100 of FIGS. 1 and 2 in accordance with one embodiment of the present invention. Referring now to FIGS. 1, 2 and 5 together, in a Form Substrate Operation 502, substrate 102, including ground plane 110, upper traces 310 and the associated electrical conductors, are formed. Substrate 102 is formed using any one of a number of techniques and the particular technique used is not essential to the present invention.

In a Mount VCSEL Device Operation 504, lower surface 112L of VCSEL device 112 is mounted to ground plane 110 with adhesive 114. Illustratively, adhesive 114 is solder, which is reflowed to mount VCSEL device 112 to ground plane 110. As another illustration, adhesive 114 is electrically conductive epoxy, which is cured to mount VCSEL device 112 to ground plane 110. However, in light of this disclosure, those of skill in the art will understand that adhesive 114 is formed of other electrically conductive adhesives in other embodiments.

In a Wirebond Operation 506, bond pads 312 are wirebonded to upper traces 310 by bond wires 314 using a wirebonder in a well-known manner. Optional, in an Encapsulate Operation 508, encapsulant 315 is dispensed to cover bond wires 314 and, optionally, VCSEL device 112, and cured.

In a Mount Window Operation 510, window 122 is mounted to substrate 102 by adhesive 123. Illustratively, adhesive 123 is an epoxy adhesive. Adhesive 123 is dispensed on to shelf 116 and/or on to the periphery of window 122. Window 122 is pressed towards shelf 116 squeezing adhesive 123, which is cured to mount window 122 to substrate 102.

In a Mount Sensor(s) Operation 512, sensors 126 are mounted to surface mount pads 124 by mounting joints 130. Illustratively, solder paste is applied, e.g., by screening, to surface mount pads 124. Optionally, solder flux is applied to the solder paste. Terminals 128 of sensors 126 are brought into abutting contact with the solder paste. The solder paste is reflowed to form mounting joints 130. Optionally, any solder flux residue generated is removed.

Advantageously, sensors 126 are mounted to surface mount pads 124 with extremely high positional placement. Accordingly, sensors 126 are positioned with respect to VCSEL device 112 with extremely high accuracy as part of VCSEL package 100.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A package comprising:
   a substrate comprising:
      a pocket defined by a base and a pocket sidewall; and
      a lead step along said pocket sidewall;
   an electronic component coupled to said substrate within said pocket, said electronic component comprising:

an active area; and an active calibration area; and a sensor coupled to said substrate, said sensor comprising a sensor area aligned with said active calibration area.

2. The package of claim 1 further comprising a window coupled to said substrate, said active calibration area being positioned adjacent a first surface of said window directly opposite of a position of said sensor area adjacent a second surface of said window.

3. A package comprising:

a substrate;

an electronic component coupled to said substrate, said electronic component comprising:

an active area; and an active calibration area;

a sensor coupled to said substrate, said sensor comprising a sensor area aligned with said active calibration area; and a window coupled to said substrate by an adhesive, said active calibration area being positioned adjacent a first surface of said window directly opposite of a position of said sensor area adjacent a second surface of said window, wherein said electronic component is located within a pocket of said substrate, said window sealing said pocket.

4. The package of claim 3 wherein said electronic component is within a cavity defined by said window, said adhesive and said pocket.

5. The package of claim 3 wherein said pocket is defined by a base and a pocket sidewall, said package further comprising a ground plane coupled to said base.

6. The package of claim 5 wherein said electronic component comprises:

a first surface comprising said active area and said active calibration area; and a second surface coupled to said ground plane and thereby coupled to said substrate.

7. The package of claim 5 further comprising a ground pad coupled to said substrate, said ground plane being electrically coupled to said ground pad.

8. The package of claim 1 wherein said electronic component is a vertical cavity surface emitting laser (VCSEL) device.

9. The package of claim 8 wherein said active area is a first vertical cavity surface emitting laser and wherein said active calibration area is a second vertical cavity surface emitting laser.

10. The package of claim 1 wherein said sensor comprises a photodiode.

11. A package comprising:

a substrate comprising a pocket;

an electronic component coupled to said substrate within said pocket, said electronic component comprising:

an active area; and an active calibration area;

a sensor comprising:

a sensor area aligned with said active calibration area; and a terminal;

a surface mount pad coupled to said substrate;

a mounting joint coupling said terminal to said surface mount pad; and a sensor pad coupled to a lower surface of said substrate, said sensor pad being electrically coupled to said surface mount pad.

12. The package of claim 11 wherein said mounting joint comprises solder.

13. A package comprising:

a substrate;

an electronic component coupled to said substrate, said electronic component comprising:

an active area; and an active calibration area;

a sensor comprising:

a sensor area aligned with said active calibration area; and a terminal;

surface mount pad coupled to said substrate;

a mounting joint coupling said terminal to said surface mount pad; and a sensor pad coupled to a lower surface of said substrate, said sensor pad being electrically coupled to said surface mount pad.

14. The package of claim 13 further comprising a sensor via, said sensor pad being electrically coupled to said surface mount pad by said sensor via.

15. The package of claim 13 further comprising:

an upper sensor via;

a lower sensor via; and an interlayer sensor trace, said sensor pad being electrically coupled to said surface mount pad by said upper sensor via, said lower sensor via, and said interlayer sensor trace.

16. The package of claim 15 wherein said upper sensor via extends between said surface mount pad and said interlayer sensor trace and wherein said lower sensor via extends between said interlayer sensor trace and said sensor pad.

17. The package of claim 11 further comprising a window coupled to said substrate, said active calibration area being position adjacent a first surface of said window directly opposite of a position of said sensor area adjacent a second surface of said window.

18. The package of claim 11 wherein said electronic component is a vertical cavity surface emitting laser (VCSEL) device.

19. The package of claim 18 wherein said active area is a first vertical cavity surface emitting laser and wherein said active calibration area is a second vertical cavity surface emitting laser.

20. The package of claim 11 wherein said sensor comprises a photodiode.

21. A package comprising:

a substrate comprising a pocket;

an electronic component coupled to said substrate within said pocket, said electronic component comprising:

a means for emitting a first electromagnetic radiation; and a means for emitting a second electromagnetic radiation; and a means for sensing said second electromagnetic radiation coupled to said substrate, said means for sensing comprising a sensor area aligned with said means for emitting a second electromagnetic radiation; and a window coupled to said substrate by an adhesive.

22. The package of claim 21 further comprising a means for coupling said means for sensing to said substrate.

23. A package comprising:

a substrate;

an electronic component coupled to said substrate, wherein said electronic component is located within a pocket of said substrate, said electronic component comprising:

a means for emitting a first electromagnetic radiation; and a means for emitting a second electromagnetic radiation;

a means for sensing said second electromagnetic radiation coupled to said substrate, said means for sensing comprising a sensor area aligned with said means for emitting a second electromagnetic radiation; and a means for sealing said pocket comprising a window and an adhesive.

24. The package of claim 23 wherein said means for sealing is transparent to said first electromagnetic radiation and to said second electromagnetic radiation.

25. The package of claim 21 wherein said first electromagnetic radiation is the same as said second electromagnetic radiation.

26. A method comprising:

coupling an electronic component within a pocket of a substrate, said electronic component comprising:

an active area; and an active calibration area;

forming bond wires between bond pads of said electronic component and traces coupled a lead step alone a pocket sidewall of said substrate;

coupling a window to said substrate to seal said pocket; and coupling a sensor to said substrate such that a sensor area of said sensor is aligned with said active calibration area.

27. The method of claim 26 further comprising:

emitting a first electromagnetic radiation with said active area; and emitting a second electromagnetic radiation with said active calibration area.

28. The method of claim 27 wherein said window is transparent to said first electromagnetic radiation and to said second electromagnetic radiation.

29. The method of claim 27 wherein said second electromagnetic radiation is measured by said sensor.

30. The method of claim 27 wherein said first electromagnetic radiation is the same as said second electromagnetic radiation.

31. The method of claim 26 wherein said electronic component is a vertical cavity surface emitting laser (VCSEL) device.

32. The method of claim 31 wherein said active area is a first vertical cavity surface emitting laser and wherein said active calibration area is a second vertical cavity surface emitting laser.

33. The method of claim 26 wherein said sensor comprises a photodiode.

34. The method of claim 26 wherein said coupling a sensor to said substrate comprises forming a mounting joint between a surface mount pad coupled to said substrate and a terminal of said sensor.

35. The method of claim 34 wherein said forming a mounting joint comprises screening solder paste and reflowing said solder paste to form said mounting joint.

36. The package of claim 1 wherein said substrate further comprises a shelf extending around a periphery of said pocket.

37. The package of claim 36 further comprising a window, a periphery of a first surface of said window being coupled to said shelf.

38. The package of claim 1 further comprising:

a ground plane coupled to said base; and an electrically conductive adhesive coupling said electronic component to said ground plane.

39. The package of claim 1 further comprising:

electrically conductive traces coupled to said lead step; and bond wires coupling said electrically conductive traces to bond pads of said electronic component.

40. The package of claim 39 further comprising an encapsulant enclosing said bond pads, said bond wires and said electrically conductive traces.

41. The package of claim 40 wherein said encapsulant fills said pocket.

* * * * *